United States Patent
Powers et al.

(10) Patent No.: US 9,767,889 B1
(45) Date of Patent: Sep. 19, 2017

(54) PROGRAMMABLE PAD CAPACITANCE FOR SUPPORTING BIDIRECTIONAL SIGNALING FROM UNTERMINATED ENDPOINTS

(71) Applicant: QUALCOMM Incorporated, San Diego, CA (US)

(72) Inventors: Scott Powers, San Diego, CA (US); Thomas Bryan, Carlsbad, CA (US); Andrew Tohme, San Mateo, CA (US); Subrahmanya Pradeep Morusupalli, Bengaluru (IN); Tin Tin Wee, San Diego, CA (US); Kenneth Dubowski, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/433,814

(22) Filed: Feb. 15, 2017

(51) Int. Cl.
| | | |
|---|---|---|
| G11C 11/40 | (2006.01) |
| G11C 11/4096 | (2006.01) |
| G11C 11/408 | (2006.01) |
| G11C 11/4094 | (2006.01) |
| H01L 25/18 | (2006.01) |
| H01L 25/065 | (2006.01) |
| H01L 23/66 | (2006.01) |
| H03H 7/38 | (2006.01) |

(52) U.S. Cl.
CPC ...... *G11C 11/4096* (2013.01); *G11C 11/4085* (2013.01); *G11C 11/4094* (2013.01); *H01L 23/66* (2013.01); *H01L 25/0652* (2013.01); *H01L 25/0657* (2013.01); *H01L 25/18* (2013.01); *H03H 7/38* (2013.01); *H01L 2223/6611* (2013.01); *H01L 2223/6627* (2013.01); *H01L 2225/0652* (2013.01); *H01L 2225/06506* (2013.01); *H01L 2225/06517* (2013.01); *H01L 2225/06586* (2013.01)

(58) Field of Classification Search
CPC ............ G11C 11/4096; G11C 11/4085; G11C 11/4094; H03H 7/38; H01L 25/18; H01L 25/0652; H01L 23/66; H01L 2223/6611; H01L 2223/6627; H01L 2225/06506; H01L 2225/065
USPC .......................................... 365/63, 191, 198
See application file for complete search history.

(56) References Cited

U.S. PATENT DOCUMENTS

| 6,127,849 A | 10/2000 | Walker |
| 6,356,106 B1 | 3/2002 | Greeff et al. |
| 6,359,815 B1 | 3/2002 | Sato et al. |
| 6,525,618 B2 | 2/2003 | Wood |
| 7,093,041 B2 | 8/2006 | Gasparik |
| 9,614,703 B2* | 4/2017 | Rahman ................. H04L 25/08 |
| 2011/0115307 A1* | 5/2011 | Yoshie ...................... G06F 1/26 307/125 |
| 2014/0028607 A1 | 1/2014 | Tan et al. |
| 2015/0205751 A1 | 7/2015 | Oh et al. |
| 2017/0085403 A1* | 3/2017 | Sun ......................... H04L 27/01 |

* cited by examiner

*Primary Examiner* — Tan T. Nguyen
(74) *Attorney, Agent, or Firm* — Qualcomm Incorporated

(57) ABSTRACT

A die is provided having an unterminated endpoint that capacitively loads its input impedance with a capacitance from capacitor while acting as a receiving endpoint and that isolates its output impedance from the capacitance while acting as a transmitting endpoint.

20 Claims, 4 Drawing Sheets

PROGRAMMABLE PAD CAPACITANCE FOR SUPPORTING BIDIRECTIONAL SIGNALING FROM UNTERMINATED ENDPOINTS

TECHNICAL FIELD

This application relates to die-to-die interfaces, and more particularly to a programmable pad capacitance for supporting unterminated bidirectional die-to-die signaling.

BACKGROUND

To prevent reflections between a transmitter and a receiver coupled through a transmission line, it is conventional to have each endpoint match its impedance to the transmission line impedance. For example, a common transmission line impedance is 50Ω such that each endpoint would also present a matching 50Ω impedance to the transmission line. As a rising edge or falling edge of a signal propagates down the transmission line from the transmitter to the receiver having such a matched impedance, there is no discontinuity of impedance between the transmission line and the receiver endpoint such that there is no reflection of the signal edge. But a matched load couples to ground and thus dissipates power, which is a problem in battery-operated devices such as smartphones or tablets. To save power, it is conventional for a chip-to-chip interface to be unterminated in mobile applications. For example, a smartphone will typically include a system-on-a-chip (SoC) that functions as the smartphone's "brain." The SoC is commonly packaged with one or more dynamic random access memories (DRAMs). To save power, various low power double data rate (LPDDR) communication protocols have been developed for the SoC/DRAM interface that use unterminated endpoints.

Although power consumption is reduced, the unterminated endpoints for the SoC and the DRAMs cause reflections of the signal edges upon reception. For example, suppose an unterminated endpoint is receiving a binary high signal following a binary zero transmission. The rising edge of the binary one signal will reflect from the receiving endpoint back to the transmitting endpoint, which in turn re-reflects the reflected signal back to the receiving endpoint, and so on in a phenomenon that is denoted herein as "ringback." The ringback noise may thus cause bit errors at the receiving endpoint, particularly in the presence of other noise sources such as crosstalk between adjacent transmission lines. To prevent the bit errors, the transmission lines may be redesigned to lower the crosstalk. But such techniques to reduce crosstalk increase manufacturing costs.

Accordingly, there is a need in the art for improved bidirectional unterminated endpoints that reduce ringback.

SUMMARY

To provide increased received signal quality, an unterminated endpoint is provided that includes a pad (which may also be denoted as an endpoint terminal) coupled to ground through a capacitor and a switch. A controller controls the switch to be closed while the unterminated endpoint functions to receive signals over the endpoint pad in a ringback reduction mode of operation. The closing of the switch during the ringback reduction mode of operation loads an input impedance for the unterminated endpoint with a capacitance from the capacitor. Conversely, the controller opens the switch while the unterminated endpoint functions to transmit signals over the endpoint pad. The opening of the switch prevents a loading of an output impedance for the unterminated endpoint with the capacitance from the capacitor.

Should the unterminated endpoint function to receive signals while the ringback reduction mode of operation is not active, the controller does not close the switch so as to not load the input impedance of the unterminated endpoint with the capacitance. For example, the controller may compare the data rate to a threshold value to distinguish whether the ringback reduction mode of operation is active. At data rates below the threshold value, the data rate is such that the ringback noise is sufficiently mooted between transmissions of successive data bits. Conversely, as the data rate increases over the threshold value, ringback noise will not be sufficiently mooted between successive data bit transmissions such that the controller closes the switch to dampen the ringback noise. The resulting selective addition of capacitance to the endpoint input impedance during signal reception is quite advantageous in that reflections of rising and falling edges of the received signal from the endpoint pad are muted because the capacitor receives charge from the signal rising edges and discharges charge to the signal falling edges. Ringback from a receiving endpoint to a transmitting endpoint is thus substantially reduced, thereby reducing bit error rates. Although the added capacitance reduces ringback from the receiving endpoint, it will tend to aggravate reflections at the transmitting endpoint. The selective connection of the capacitor only while the endpoint functions as a receiver is thus quite advantageous.

These and other advantageous features may be better appreciated through the following detailed description.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

To reduce ringback from a receiving endpoint, an unterminated endpoint's pad is loaded with a capacitance through a switch activated by a controller. The controller closes the switch to couple the pad to ground through the capacitor so that an input impedance for the unterminated endpoint is loaded by the capacitance of the capacitor while the unterminated endpoint functions as a receiving endpoint in a ringback reduction mode of operation. Should the unterminated endpoint then function as a transmitting endpoint (or as a receiving endpoint in which the ringback reduction mode of operation is not active), the controller opens the switch so that an output impedance of the unterminated endpoint is not loaded by the capacitor.

Figure 1:
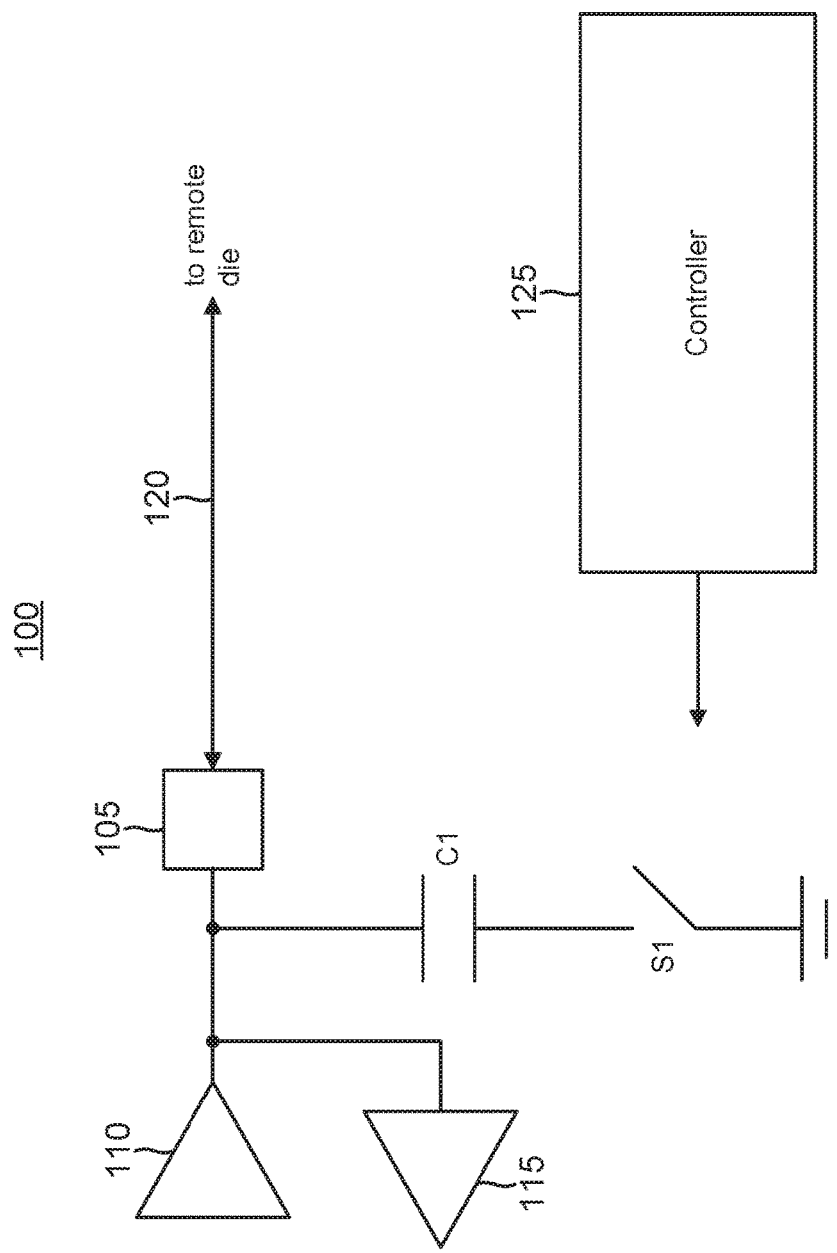
FIG. 1 is a diagram of an example unterminated endpoint in accordance with an aspect of the disclosure.

Turning now to the drawings, an example unterminated endpoint 100 is shown in FIG. 1. As used herein, the term endpoint may be used interchangeably with an input/output (I/O) circuit. Unterminated endpoint 100 includes a pad 105 for a host die (not illustrated) including unterminated endpoint 100. Pad 105 is a generic representation of a I/O terminal for the host die such as an actual pad or pin that the host die uses to connect to an external transmission line 120. A remote die (not illustrated) includes an analogous endpoint to communicate with the host die over external transmission line 120. External transmission line 120 is configured to have a characteristic impedance such as 50Ω. As implied by its name, unterminated endpoint 100 does not match this characteristic impedance through any sort of resistor coupled between pad 105 and ground to prevent the power loss that would otherwise occur through such a resistor. Unterminated endpoint 100 is bidirectional such that it can both receive signals at pad 105 from external transmission line 120 and transmit signals over pad 105 to propagate down external transmission line 120 to the remote die. Thus, unterminated endpoint 100 includes a receiver 115 for receiving signals from pad 105 as well as a driver 110 for driving signals over pad 105 to external transmission line 120.

The remote die transmits binary signals over external transmission line 120 to unterminated endpoint 100 by either charging transmission line 120 to a binary high voltage or by grounding external transmission line 120. In other embodiments, external transmission line 120 may be part of a differential transmission line but the following discussion will assume that the communication over external transmission line 120 is single-ended without loss of generality. In such single-ended transmission, a transmission of a binary one bit from the remote die following a transmission of a binary zero results in a rising edge being received at pad 105 such that the pad's voltage suddenly rises from ground to the binary high voltage. Due to the discontinuity of the input impedance for unterminated endpoint 100 as compared to the characteristic impedance for external transmission line 120, the rising edge will tend to reflect from unterminated endpoint 100 and propagate down external transmission line 120 to the remote die as part of the phenomenon denoted as "ringback" as discussed earlier. Similarly, a transmission of a binary zero bit from the remote die following a transmission of a binary one bit results in a falling edge being received at pad 105 such that the pad's voltage suddenly falls from the binary high voltage to ground. The impedance discontinuity at pad 105 will similarly tend to reflect the falling edge back to the remote die over external transmission channel 120.

To substantially reduce such ringback despite the impedance discontinuity, unterminated endpoint 100 includes a capacitor C1 that is connected between pad 105 and a switch S1 that in turn connects to ground. In an alternative embodiment, switch S1 may instead be located between capacitor C1 and pad 105. A controller 125 controls switch S1 to be closed while unterminated endpoint 100 functions as a receiving endpoint and to be open while unterminated endpoint 100 functions as a transmitting endpoint. In particular, driver 110 may have an active mode of operation in which it functions to transmit signals over pad 105 to the remote die. Similarly, unterminated endpoint 100 may have a ringback reduction mode of operation in which receiver 115 functions to receive signals over pad 105 from the remote die. Controller 125 is configured to close switch S1 while unterminated endpoint 110 is in the ringback reduction mode of operation and to open switch S1 while driver 110 is in its active mode of operation.

Note that ringback noise becomes less problematic as the data rate reduces. At such reduced data transmission rates, the ringback noise has an opportunity to sufficiently attenuate during the relatively long interval from one data bit transmission to the next. But at higher data rates, the interval between successive data bit transmissions becomes attenuated such that ringback noise becomes problematic. Controller 125 may thus determine whether the ringback reduction mode of operation is active by determining whether the data transmission rate is greater than a threshold value while a receive enable signal (not illustrated) is asserted while receiver 115 functions to receive data. For example, controller 125 may compare a clock signal that is synchronous with the data transmission rate to a threshold value while receiver 115 is active to determine whether the ringback reduction mode of operation is active. Moreover, note that controller 125 may also respond to an override signal (not illustrated) such that it refrains closing switch S1 regardless of the data transmission rate. In response to the activation of the ringback reduction mode of operation, controller 125 closes switch S1. Conversely, controller 125 may respond to the de-activation of the ringback reduction mode of operation by opening switch S1 such as would happen while driver 110 functions in its active mode of operation. Alternatively, controller 125 may also open switch S1 even though receiver 115 is active because of the data transmission rate being below the threshold value.

The loading of pad 105 with the capacitance from capacitor C1 while switch S1 is closed is quite advantageous with regard to dampening ringback. For example, capacitor C1 may absorb charge from a rising edge of a binary one bit signal transmission being received at pad 105 so as to dampen the reflection of the rising edge from pad 105 back onto external transmission line 120. Similarly, capacitor C1 may release charge to a falling edge of a binary zero bit signal being received at pad 105 so as to dampen the reflection of the falling from pad 105 back onto external transmission line 120.

Switch S1 may be implemented using any suitable transistor. For example, an unterminated endpoint 200 shown in FIG. 2 includes an n-type metal oxide semiconductor (NMOS) transistor M1 and another NMOS transistor M2 to act as switches. Each transistor M1 and M2 connects to its own corresponding capacitor, which in unterminated endpoint 200 are implemented using the gate capacitance of a pair of transistors M3 and M4, respectively. Transistor M1 connects between ground and the drain/source terminals of transistor M3, which has a gate connected to pad 105. Similarly, transistor M2 connects between ground and the drain/source terminals of transistor M4, which has a gate connected to pad 105. Controller 125 drives the gates of transistors M1 and M2 to determine whether they are on or off. When transistor M1 is switched on, the gate capacitance of corresponding transistor M3 loads pad 105. Similarly, when transistor M2 is switched on, the gate capacitance of corresponding transistor M4 loads pad 105. In this fashion, controller 125 may tune for the desired amount of capacitance for loading pad 105 by selectively switching on just one or both of transistors M1 and M2. In alternative embodiments, additional capacitors may be added to increase the tuning range of the desired capacitance for loading pad 105 while terminated endpoint 200 functions as a receiving endpoint.

Implementing capacitor C1 through the gate capacitance of a transistor such as M3 or M4 is advantageous in that no external capacitors are necessary. The amount of gate capacitance for a given transistor will vary depending upon the process node but a typical value ranges from approximately 200 to 400 femtofarads. It will be appreciated, however, that capacitor C1 may comprise an external capacitor in alternative embodiments. In addition, note that transistors M1 and M2 may be rearranged to instead be located between their respective capacitors and pad 105. Similarly, transistors M1, M2, M3, and M4 may instead be implemented as p-type metal oxide semiconductor (PMOS) transistors.

In one embodiment, the combination of switch S1 and capacitor C1 of FIG. 1 (or transistors M1 and M3 of FIG. 2 or transistors M2 and M4 of FIG. 2) may be deemed to comprise a means for loading pad 105 with a capacitance while receiver 115 is active and a data rate for receiver 115 is above a threshold value and for isolating the pad from the capacitance while driver 110 is active or while receiver 115 is active and the data rate for receiver 115 is below the threshold value.

Figure 3:
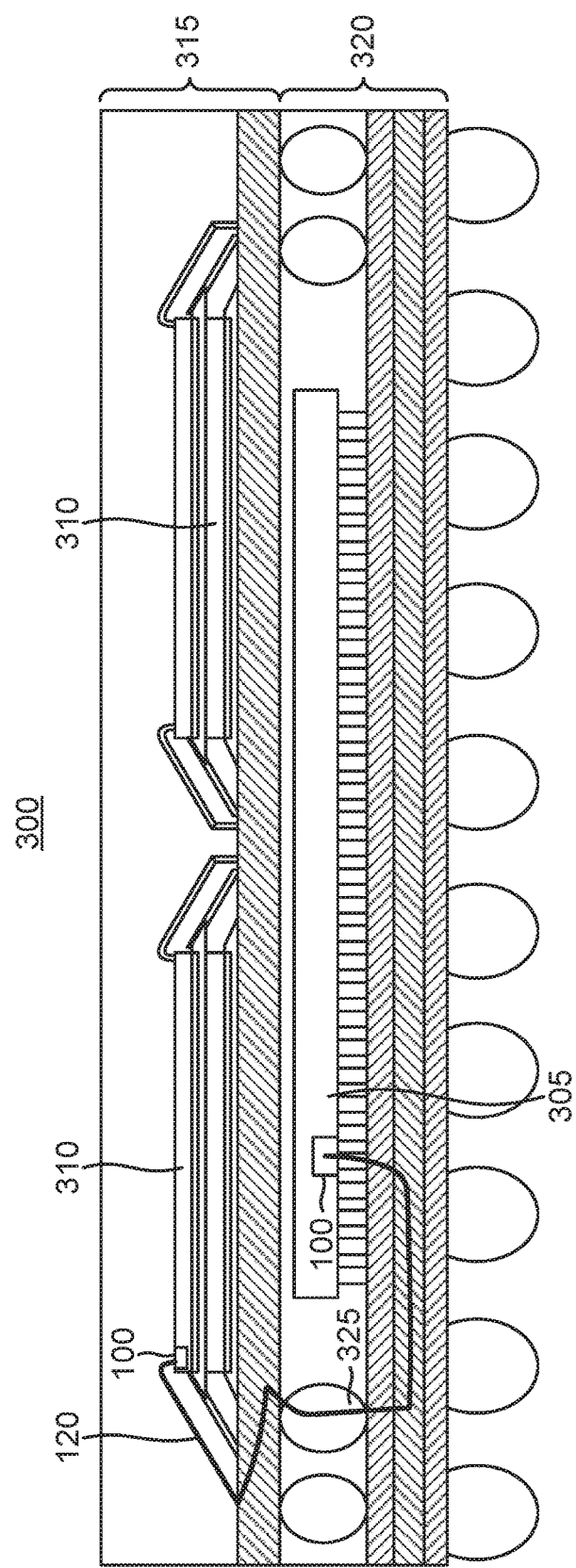
FIG. 3 is a diagram of a package-on-package integrated circuit in which the dies include a plurality of unterminated endpoints such as shown in FIG. 1 or FIG. 2 in accordance with an aspect of the disclosure.

The unterminated endpoints disclosed herein have wide application for die-to-die input/output (I/O) interfaces. For example, an SoC die 305 may include a plurality of unterminated endpoints 100 for communicating with corresponding endpoints in a plurality of DRAM dies 310 as shown in FIG. 3 (for illustration clarity, just one unterminated endpoint 100 is shown for SoC die 305 and for one of DRAM dies 310). SoC die 305 and DRAM dies 310 are arranged to form an example package-on-package (PoP) integrated circuit package 300. A bottom package 320 includes SoC die 305 whereas an upper package 315 includes four DRAM dies 310. As known in the PoP arts, each package 320 and 315 includes a substrate such as an organic substrate having metal layers that are patterned to form the desired external transmission lines 120 (for illustration clarity, only one external transmission line 120 is shown in FIG. 3 extending from SoC die 305 to an active one of DRAM dies 310). In particular, external transmission line 120 may include a copper pillar from a pad for unterminated endpoint 100 in SoC die 305 that couples through traces in the organic substrate in bottom package 320 to a solder ball 325 connecting the bottom package organic substrate to the upper package organic substrate. External transmission line 120 continues through traces in the upper package organic substrate to connect to a wire bond that leads to the pad for unterminated endpoint 100 in the active one of DRAM dies 310. The ringback between the various DRAM dies 310 and SoC die 305 will thus be advantageously dampened as discussed herein.

Figure 2:
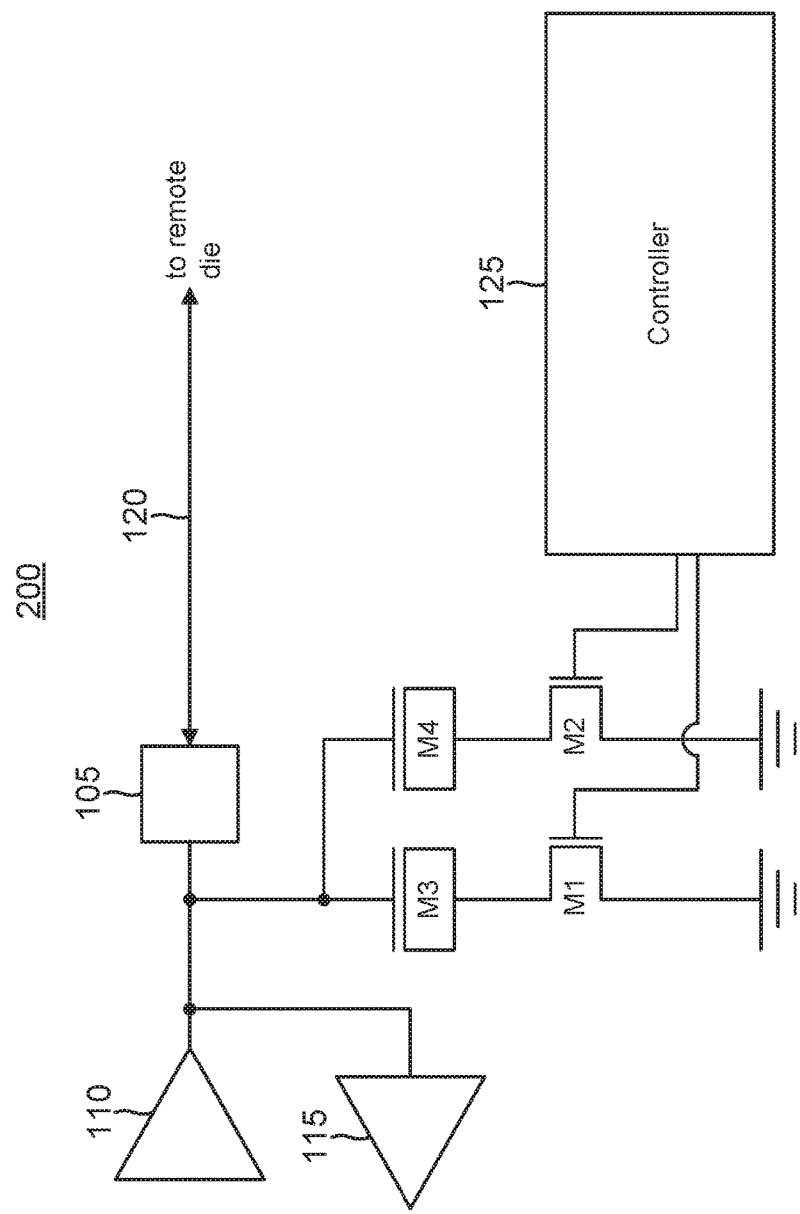
FIG. 2 is a circuit diagram for an embodiment of the unterminated endpoint of FIG. 1 in accordance with an aspect of the disclosure.
Figure 4:
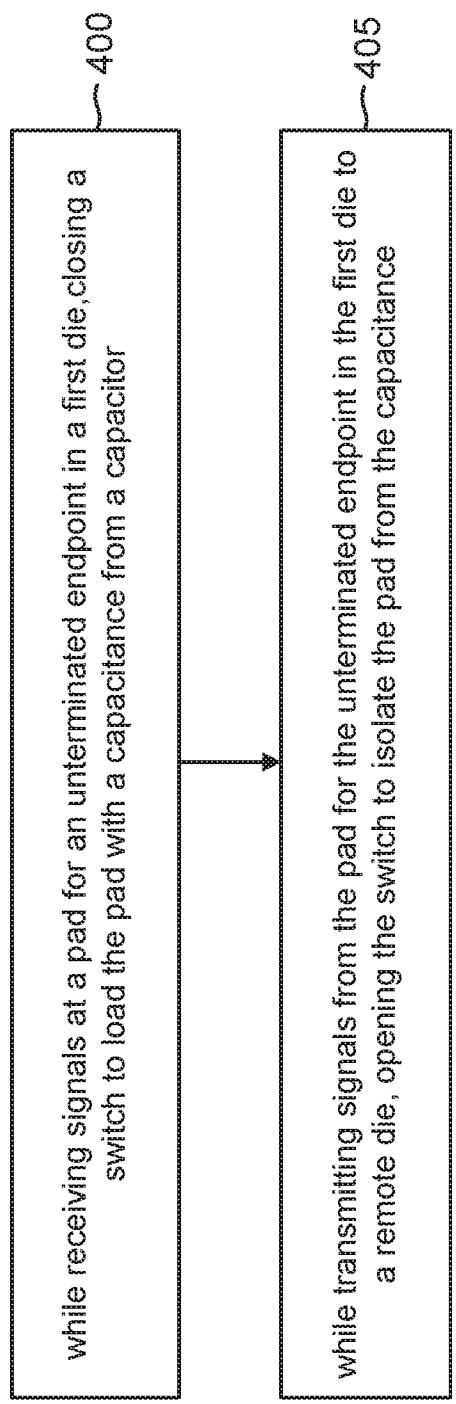
FIG. 4 is a flowchart for an example method of operation for an unterminated endpoint in accordance with an aspect of the disclosure.

An example method of operation for an unterminated endpoint will now be discussed with regard to the flowchart of FIG. 4. The method includes an act 400 of, while receiving signals at a pad for an unterminated endpoint in a first die, closing a switch to load the pad with a capacitance from a capacitor. The closing of switch S1 as discussed with regard to FIG. 1 or the switching on of transistors M1 and/or M2 of FIG. 2 is an example of act 400. The method further includes an act 405 of, while transmitting signals from the pad for the unterminated endpoint in the first die to a remote die, opening the switch to not load the pad with the capacitance. The opening of switch S1 as discussed with regard to FIG. 1 or the switching off of transistors M1 and M2 of FIG. 2 is an example of act 405.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. An unterminated endpoint for a first die, comprising:
a pad;
a driver having an active mode in which the driver is configured to drive signals over the pad to a remote die;
a receiver having an active mode in which the receiver is configured to receive signals over the pad from the remote die;
a capacitor;
a switch connected to the capacitor, wherein the switch is configured to couple the pad to ground through the capacitor while the switch is closed and to not couple the pad to ground through the capacitor while the switch is open; and
a controller configured to close the switch while the receiver is in the active mode and to open the switch while the driver is in the active mode.

2. The unterminated endpoint of claim 1, wherein the controller is further configured to close the switch only while both the receiver is in the active mode and a data rate for the receiver is above a threshold value.

3. The unterminated endpoint of claim 1, wherein the capacitor comprises a gate of a transistor.

4. The unterminated endpoint of claim 1, wherein the switch is connected between the capacitor and ground.

5. The unterminated endpoint of claim 1, wherein the capacitor comprises a plurality of capacitors, and wherein the switch comprises a plurality of switches corresponding on a one-to-one basis with the plurality of capacitors.

6. The unterminated endpoint of claim 1, wherein the controller is further configured to selectively close switches from the plurality of switches to tune a capacitive load from the capacitors while the receiver is in the active mode.

7. The unterminated endpoint of claim 1, wherein the switch comprises an NMOS transistor, and wherein the controller is configured to close the switch by charging a gate of the NMOS transistor.

8. The unterminated endpoint of claim 1, wherein the first die is a system-on-a-chip (SoC) die and wherein the remote die is a dynamic random access memory (DRAM) die.

9. The unterminated endpoint of claim 8, wherein the SoC die is integrated within a bottom package of a package-on-package integrated circuit and wherein the DRAM die is integrated within a top package of the package-on-package integrated circuit.

10. The unterminated endpoint of claim 9, wherein the DRAM die is a low power double data rate (LPDDR) DRAM die.

11. The unterminated endpoint of claim 1, wherein the DRAM die comprises a plurality of DRAM dies.

12. A method, comprising:
while receiving first signals at a pad for an unterminated endpoint in a first die, closing a switch to load the pad with a capacitance from a capacitor; and
while transmitting second signals from the pad for the unterminated endpoint in the first die to a remote die, opening the switch to not load the pad with the capacitance.

13. The method of claim 12, wherein receiving the first signals occurs at a first data rate above a threshold value, the method further comprising:
while receiving third signals at the pad, opening the switch, wherein receiving the third signals occurs at a second data rate below the threshold value.

14. The method of claim 12, wherein closing the switch connects the pad to ground through a gate capacitance of a transistor to capacitively load the pad for the unterminated endpoint.

15. The method of claim 14, wherein closing the switch connects a drain and source of the transistor to ground.

16. The method of claim 14, wherein opening the switch isolates the gate capacitance of the transistor from ground.

17. The method of claim 12, further comprising: tuning a capacitance for the capacitor to adjust the capacitive loading of the pad.

18. An unterminated endpoint for a die, comprising:
a pad;
a driver having an active mode in which the driver is configured to drive signals over the pad to a remote die;
a receiver having an active mode in which the receiver is configured to receive signals over the pad from the remote die;
a capacitor; and
means for loading the pad with a capacitance from the capacitor while the receiver is in the active mode and a data rate for the receiver is above a threshold value and for isolating the pad from the capacitor while the driver is in the active mode or while the receiver is in the active mode and a data rate for the receiver is below a threshold value.

19. The unterminated endpoint of claim 18, wherein the capacitor comprises a gate for a transistor.

20. The unterminated endpoint of claim 19, wherein the transistor comprises an NMOS transistor.

\* \* \* \* \*